United States Patent
Burke

(10) Patent No.: US 9,632,726 B1
(45) Date of Patent: Apr. 25, 2017

(54) MODULAR DEVICE AND METHOD OF OPERATION

(71) Applicant: Arch Systems Inc., Mountain View, CA (US)

(72) Inventor: Timothy Matthew Burke, Mountain View, CA (US)

(73) Assignee: Arch Systems Inc., Mountain View, CA (US)

( * ) Notice: Subject to any disclaimer, the term of this patent is extended or adjusted under 35 U.S.C. 154(b) by 0 days.

(21) Appl. No.: 15/287,203

(22) Filed: Oct. 6, 2016

Related U.S. Application Data

(60) Provisional application No. 62/239,446, filed on Oct. 9, 2015, provisional application No. 62/383,894, filed on Sep. 6, 2016.

(51) Int. Cl.
  *G06F 3/06* (2006.01)
  *G06F 17/30* (2006.01)

(52) U.S. Cl.
  CPC .......... *G06F 3/0653* (2013.01); *G06F 3/0604* (2013.01); *G06F 3/0644* (2013.01); *G06F 3/0656* (2013.01); *G06F 3/0679* (2013.01); *G06F 17/30958* (2013.01)

(58) Field of Classification Search
  CPC .... G06F 3/0653; G06F 3/0604; G06F 3/0644; G06F 3/0656; G06F 3/0679; G06F 17/30958
  See application file for complete search history.

(56) References Cited

U.S. PATENT DOCUMENTS

| 9,055,011 B2 | 6/2015 | Li et al. |
| 2013/0097459 A1 | 4/2013 | Bell et al. |
| 2016/0152211 A1* | 6/2016 | Owens ................. B60R 25/102 348/36 |
| 2016/0225562 A1* | 8/2016 | Franks .................. H02H 3/006 |

OTHER PUBLICATIONS

Sengupta, Dipanjan, "System Design Principles for Heterogeneous Resource Management and Scheduling in Accelerator-Based Systems", a Thesis Presented to the Academic Faculty, Georgia Institute of Technology, Aug. 2016.
Totalphase, "Support Question of the Week: for Long-Term Data Captures with the Beagle Protocol Analyzer, How Can I Expand the Available Memory for Storage?" http://www.totalphase.com/blog/2014/11/long-term-data-captures-beagle-protocol-analyzer-can-expand-available-memory-storage/, Nov. 4, 2014.

* cited by examiner

*Primary Examiner* — Eric S Cardwell
(74) *Attorney, Agent, or Firm* — Jeffrey Schox; Diana Lin

(57) ABSTRACT

A modular system including a set of functionality tiles and a control tile storing a storage structure, an initialization file, and operation instructions. The method for operating a custom device made using the modular system includes: sending operation settings for each tile to the respective tile upon device initialization; operating each tile based on the operation settings; writing the output from each tile to the storage structure; monitoring data streams within the storage structure for a trigger event; reading data off the storage structure in response to occurrence of the trigger event; and processing the read data according to a processing function specified by the operation instructions.

20 Claims, 9 Drawing Sheets

MODULAR DEVICE AND METHOD OF OPERATION

CROSS-REFERENCE TO RELATED APPLICATIONS

This application claims the benefit of U.S. Provisional Application No. 62/239,446 filed 9 Oct. 2015, and U.S. Provisional Application No. 62/383,894, filed 6 Sep. 2016, which are both incorporated in their entirety by this reference.

TECHNICAL FIELD

This invention relates generally to the modular device field, and more specifically to a new and useful system and method for modular device operation in the modular device field.

DESCRIPTION OF THE PREFERRED EMBODIMENTS

The following description of the preferred embodiments of the invention is not intended to limit the invention to these preferred embodiments, but rather to enable any person skilled in the art to make and use this invention.

1. Overview.

Figure 1:
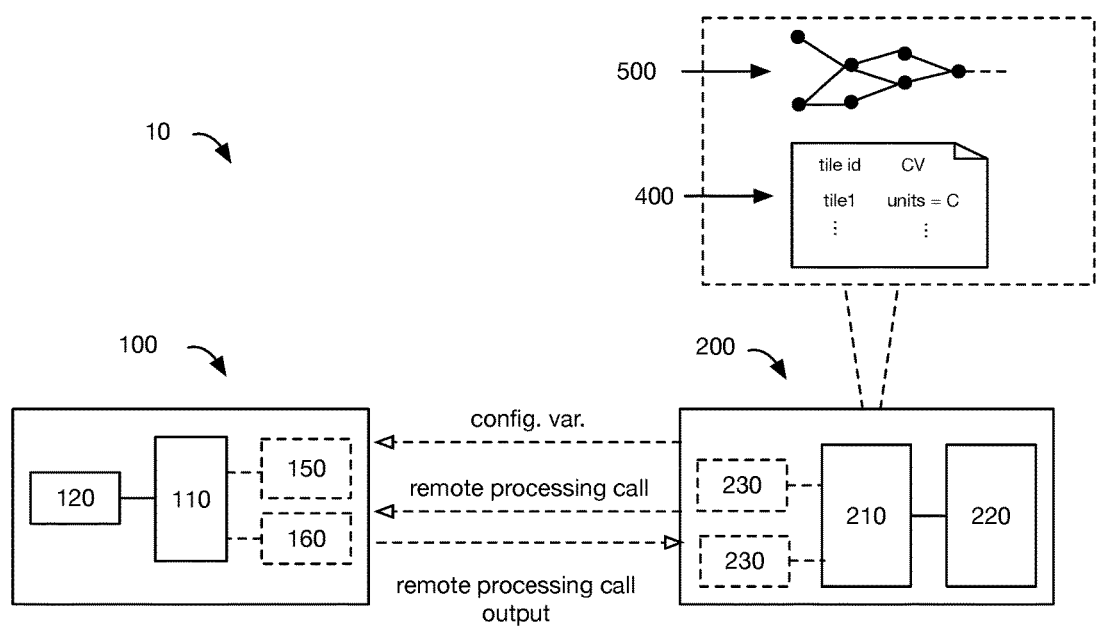
FIG. 1 is a schematic representation of the modular system.

As shown in FIG. 1, the modular system 10 includes: a set of functionality tiles 100 and a control tile 200 storing a storage structure 300, an initialization file 400, and operation instructions 500. The modular system 10 provides an easily reconfigurable system that enables creation of custom devices, each with vastly different functionalities, using the same set of building blocks. For example, a first subset of functionality tiles can be combined to build a flow monitoring device that remotely monitors the water output of a well, while a second subset of functionality tiles can be combined to build a security camera. The method of operation provides a standardized communication protocol and control paradigm across the building blocks, such that any number of building blocks can be used in any manner.

Figure 3:
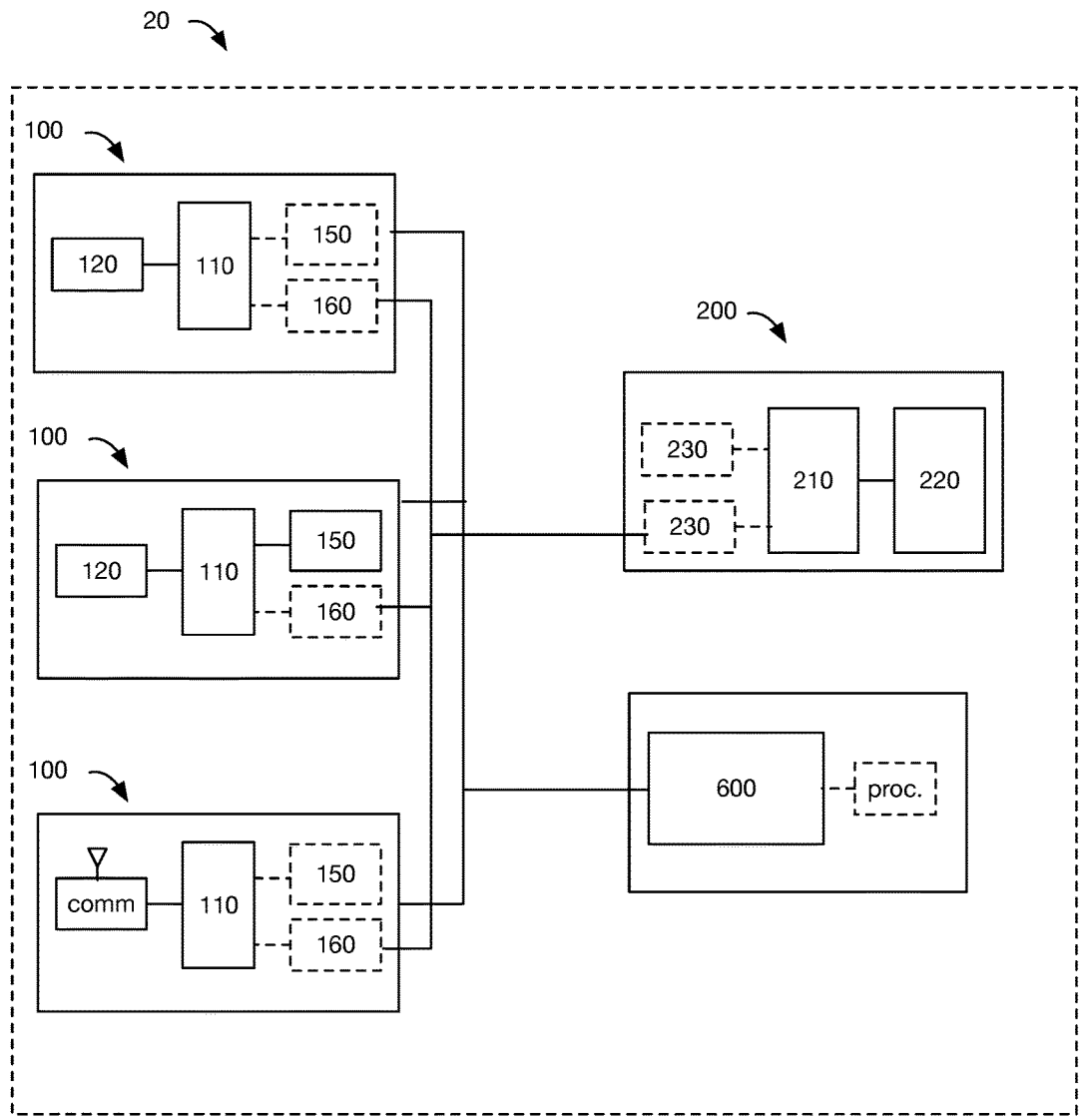
FIG. 3 is a schematic representation of an example custom device.

The system and method are preferably used by a device supplier to create a custom device 20, an example of which is shown in FIG. 3. The custom device is preferably a remote monitoring device that periodically transmits some or all sensor measurements or derivatory data to a remote computing system (e.g., server system). However, the custom device can be any other suitable device.

2. Benefits

This system and method can confer several benefits.

First, in some embodiments, each tile is a self-contained device. In particular, each tile includes both a stand-alone processing system running a set of stand-alone code defining the tile's operation. Device interaction with the tile can be limited to a set of standardized tile interface types (e.g., configuration variables and remote processing calls), where each tile can interpret the standard inputs in any internal manner (e.g., using any method, machine language, etc.) as long as it outputs tile outputs in the standardized output form. By decoupling the tile's functionality from the tile's internal programming, this system and method enables the tiles to be ported across any custom device that conforms to the standardized interface paradigm. This separation also allows different tile manufacturers to develop their tiles independently, without collaboration about shared syntax or libraries.

Second, the system and method provide a simple device logic-creation process that link different tiles' functionalities together with processing functions to create the operation logic (sensor graph) for the resultant custom device. In some embodiments, the operation logic is stored on the custom device (e.g., in the control tile) in form of a graph data structure. Graph data structures can be particularly useful in modular systems that enable any number of tiles to be joined to a central control system (e.g., the control tile), as processing requirements do not scale with the dataset size. In other words, the graph data structure allows the control tile's processing requirements to be substantially agnostic to the number of functionality tiles connected to the control tile. The graph data structure also enables nodes (e.g., tiles, processing functions, etc.) to be easily added and removed to the device, without requiring code changes to the remainder of the device logic.

Furthermore, structuring the operation logic as a graph data structure can enable system operation specifications (e.g., power requirements, runtime requirements, memory requirements, etc.) to be easily automatically determined, particularly when each tile's operation requirements (e.g., static power draw, power required to run a tile function, time to execute the tile function, device memory required to store the tile output, etc.) are known. In particular, the graph data structure can be analyzed on an edge-by-edge basis to estimate the virtual device's resource requirements, wherein the estimated requirements can be used to determine whether the components selected by the user for the device (e.g., power source and control tile) can support the functionality described by the operation logic. When the selected resources are determined to be insufficient or to be operating near the limits of their capabilities, the user can be notified of the deficiency, secondary resources (e.g., with higher capacities, etc.) can be recommended for inclusion in the device, alternative operation logic can be recommended, or other actions can be automatically taken. Since this can all be done based on the graph data structure and tile specifications at the virtual planning stage, this allows troubleshooting and device specifications to be determined before building and testing any physical device prototypes. This, in turn, enables faster device development time.

Third, embodiments of the system and method leverage a single, centralized control system that both manages the interaction between tiles and performs the majority of the device operations, based on the device operation logic. This allows different tiles to be easily added or removed from the device, since the only component that needs to be reprogrammed is the centralized control system. This can also allow the custom device to be field-programmable (e.g., be updated or entirely reprogrammed in-situ). Further, the system and method can leverage a centralized initialization file that controls initialization of all tiles. Centralizing the initialization information can enable the entire population of tiles to be reconfigured at once, instead of individually reconfiguring each tile when a change needs to be made to the device. This can also allow the custom device to be field-programmable (e.g., be updated or entirely reprogrammed in-situ).

Fourth, embodiments of the system and method leverage a single centralized output buffer that stores the outputs from all tiles and processing functions. The centralized buffer creates a central repository for all outputs, such that downstream functions and tiles in the device logic do not need to know the source tile address(es) to retrieve tile outputs. Output aggregation into a single buffer allows the system to dynamically reallocate memory to different tiles on demand, which removes the need to partition the memory and assign specific memory partitions to different tiles. In some variants, all tile outputs can be written to the buffer, independent of which downstream processes use the tiles. This allows maximum flexibility in the downstream logic. If no processes in the downstream logic use a tile output, it is simply ignored and eventually overwritten (e.g., when the buffer is a circular buffer). In some variants, the downstream processes have read-only capabilities off the buffer (e.g., downstream processes cannot consume or delete the tile output from the buffer), which allows the same tile output to remain available for multiple downstream processes that may need the tile output at different times.

Fifth, embodiments of the system and method leverage a standard data output format having a fixed size. This enables centralized memory management, such that large measurements (e.g., images, audio files) do not consume the limited memory available. In some variants, the system and method can handle large measurements by storing the measurements at the tile and storing a measurement reference in the centralized buffer.

However, the system and method can confer other benefits.

3. System.

The modular system 10 includes: a set of functionality tiles 100 and a control tile 200 storing a storage structure 300, an initialization file 400, and operation instructions 500. Different combinations of the functionality tiles can be easily combined to create a plurality of custom devices 20.

The combination of functionality tiles is preferably selected by a user (e.g., the device supplier), but can be automatically determined (e.g., wherein the user selects a desired device function or type) or otherwise determined. Each tile within a device is preferably separate and/or discrete (e.g., physically or conceptually) from the other tiles, but can alternatively be merged with one or more tiles. In a first example, the custom device includes a plurality of physically discrete tiles that are connected to by a common bus and mounted to a common board. In a second example, the custom device includes a plurality of conceptually discrete subcircuits manufactured on same circuit board, wherein each subcircuit has the same components and/or functionality as the physically discrete tiles. However, the custom device and tiles can be otherwise configured.

The resultant custom devices can be used with a remote computing system (e.g., remote server system, remote user devices, etc.), external devices (e.g., pumps, actuators, external sensors, etc.), or any other suitable external system.

The functionality tile 100 (tile) of the system 10 functions to perform a predefined function, and preferably functions as a substantially stand-alone device capable of performing said function (e.g., once power is provided). Examples of the predefined function can include: sensing (e.g., sampling images, ambient temperature, ambient pressure, flow rate, etc.), communicating, actuating, or any other suitable function. The tile is preferably designed, programmed, and/or manufactured by a tile manufacturer, wherein different tiles can be made by the same or different tile manufacturers. In one variation, different tiles within the same custom device can be programmed using different (e.g., incompatible) programming libraries or languages. However, different tiles within the same custom device can share programming constructs or be otherwise related.

Each functionality tile 100 includes an active component and a processing system 110. Each functionality tile can optionally include a communication system, on-board memory, or any other suitable component.

Figure 2A:
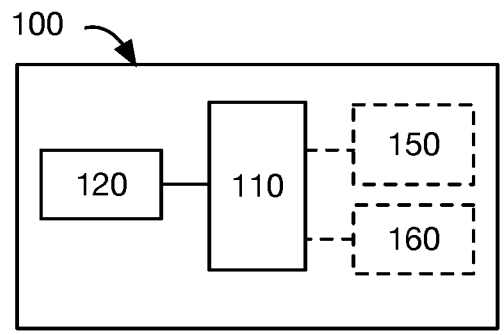
FIGS. 2A-2D are schematic representations of a first, second, third, and fourth example of a functionality tile, respectively.
Figure 2B:
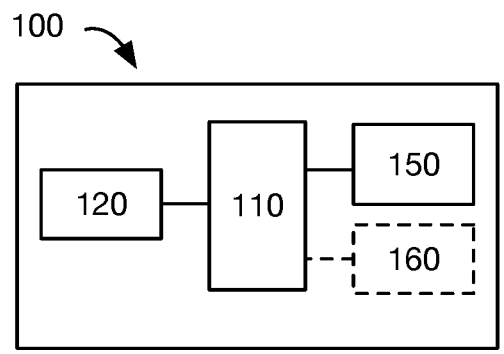
Figure 2C:
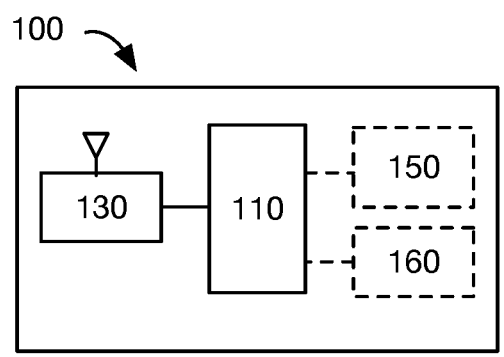
Figure 2D:
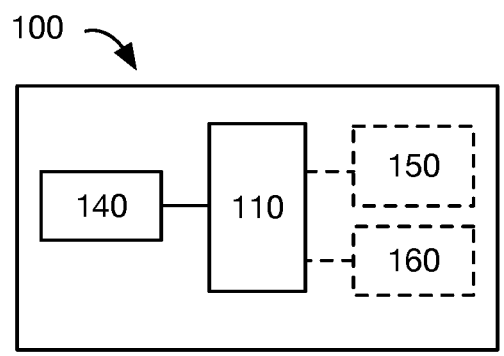

The active component of the tile provides the predefined functionality of the tile. The active component can be an input (e.g., sensor 120 as shown in FIGS. 2A and 2B), an output (e.g., actuator 140 as shown in FIG. 2C, motor controller, communication system 130 as shown in FIG. 2D), or be any other suitable component. Examples of inputs include: cameras, microphones, accelerometers, gyroscopes, IMUs, magnetometers, altimeters, touchscreens, optical sensors, pressure sensors, flow sensors, Hall effect sensors, voltage meters, GPS, or any other suitable input. Examples of outputs include: communication radios, such as WiFi, Bluetooth, cellular, NFC, or Zigbee radios; actuators, such as valves, pistons, or motors; speakers; heating elements; electromagnetic wave-emitting elements (e.g., LEDs); or any other suitable output. Each tile can include one or more active components of the same or different type. For example, an imaging tile can include a camera (e.g., CMOS array), a Bluetooth radio, and a communication bus control module.

The processing system 110 of the tile 100 functions to control tile operation, including active component operation (e.g., signal sampling). The processing system can optionally control tile interaction with external components, such as the control tile and/or other tiles. In one variation, the processing system receives a remote processing call from a secondary tile (e.g., the control tile), determines the internal function associated with the remote processing call (e.g., set of operation instructions, code block, etc.), and executes the internal function referenced by the remote processing call. The processing system preferably includes one or more processors (e.g., microprocessor, CPU, GPU, etc.), and can optionally include processing memory (e.g., volatile memory such as RAM, nonvolatile memory such as flash, etc.). The processing memory can store tile operation instructions or logic (e.g., remote processing calls and associated functions), tile operation settings (e.g., configuration variable values), or other tile operation data. The processing system is preferably specific to each tile, and is preferably operably connected to each active component of the tile. Each tile can include one or more processing systems.

The on-board memory 150 of the tile functions to store data generated by or consumed by the active component. Examples of on-board memory include non-volatile memory (e.g., flash), volatile memory (e.g., RAM), or any other suitable computer memory. Tiles that generate or use data formats above (e.g., exceeding) a threshold data size preferably include auxiliary on-board memory, while tiles that generate or use data formats below the threshold data size preferably do not include auxiliary on-board memory. For example, an imaging tile that samples measurements (e.g., images) above the threshold size and a communication tile that needs to cache large amounts of data can both include on-board memory while a temperature tile that samples temperature measurements below the threshold size can lack on-board memory. The threshold size can be set by the storage structure protocol, and be the size of each data entry that can be written to the storage structure (e.g., 32-bit, 64-bit). However, the threshold size can be otherwise set. In operation, tiles including on-board memory can store the generated data on the on-board memory, and write a tile output satisfying the data size threshold to the device memory (e.g., the central tile memory). The tile output generated by such tiles can include a reference to the data stored on the on-board memory, such as an identifier for the tile, an identifier for the data (e.g., data address on the tile memory), an RPC identifier for a remote processing call to retrieve the data (e.g., data return call), or any other suitable referential information. When the data needs to be used, the data can be retrieved from the tile memory (e.g., by the control tile, the communication tile, etc.) based on the tile output information. However, all tiles can include or lack on-board memory. The on-board memory can be larger than, smaller than, or otherwise related to the device memory.

The communication module 160 of the tile functions to transceive (e.g., transmit and/or receive) data with external components. For example, the communication module can communicate with the control tile, with other tiles within the same device, with a remote computing system, or with any other suitable component. The communication module preferably broadcasts data to a common communication channel (e.g., bus, local wireless network, etc.), but can alternatively send the data to a specific endpoint over a dedicated channel or otherwise send data. The communication module preferably reads data addressed to the respective tile off the common communication channel, but can alternatively request data from external components or otherwise receive data. The communication module can be wired or wireless. The communication module can support a short-range protocol or a long-range protocol. Examples of the communication module include: a communication bus module (e.g., configured to connect to a communication bus), a WiFi radio, a Zigbee radio, a cellular radio, an NFC radio, a Bluetooth radio, or any other suitable communication system. The communication module is preferably connected to the processing system but can be additionally or alternatively connected to any other suitable component. Each tile can include one or more communication modules. In one example, all tiles can include both a communication bus module and a short-range or low-power protocol radio (e.g., Bluetooth). However, the tiles can include any suitable number of any suitable combination of the communication modules discussed above.

However, the functionality tile can optionally include power management systems, clocks, or any other suitable component.

Each functionality tile is preferably associated with a set of tile interfaces, which enable external components to interact with the tile. Tile interfaces can include configuration variables, remote processing calls, or any other suitable tile interface.

Configuration variables of the tile interfaces are preferably variables used in tile operation, such as units, sampling frequency, or other variables, but can be any other suitable variable. Each tile can include required variables, which must be set prior to tile operation (e.g., required variables, critical variables), and can optionally include optional variables that do not need to be set for the tile to operate. The required variables can additionally or alternatively be further subdivided into device-specific variables, which must always be received from the control tile (e.g., from the initialization file) prior to tile operation, and default variables for which a default value (stored by the control tile or the tile itself) can be used. However, the required variables or default variables can be otherwise subdivided, and the values for the required variables or default variables can be otherwise determined by any suitable processing system. However, the tile can use any other suitable set of configuration variables.

A remote processing call (RPC) of the tile interfaces function to generate a tile output having a value. Examples of RPCs include: data sampling calls (e.g., record an image, sample the temperature, operate the active component), data transmission calls, tile sub-component utilization calls, or other calls. The remote processing call can be associated with a tile function (e.g., execution instructions, a code block) stored by the tile memory, wherein the tile function is executed (e.g., by the tile processor) when the tile receives the remote processing call. The remote processing call can optionally accept parameters set by the requesting component (e.g., the control tile), wherein the parameter values can be used by the tile when executing the associated function. However, the remote processing call can be otherwise used. The function associated with the remote processing call is preferably executed when the remote processing call is received at the tile, but can alternatively be automatically performed (e.g., at a predetermined frequency set by a configuration variable) or executed at any other suitable time.

Each remote processing call can optionally be associated with a known execution duration (or range), known power consumption or range (e.g., the amount of power consumed or current needed to execute the call), known memory requirement or range (e.g., the amount of device memory that will be needed to store the RPC output), or other RPC operation parameter values. The tile can additionally be associated with a known startup or initialization duration, static power draw (e.g., amount of power to initialize the tile, amount of power consumed per unit time to keep the tile in a standby state), or other tile operation parameter values. These operation parameter values can be set by the manufacturer, determined through tile testing, or otherwise determined.

The available tile interfaces (e.g., configuration variables that can be configured, RPCs that can be called) are preferably predetermined by the tile manufacturer, but can alternatively be user-specified or otherwise determined. The available tile interfaces are preferably fixed (e.g., wherein an end user cannot change the specified tile interfaces for the tile), but can alternatively be adjustable. The values of the tile interfaces (e.g., values of the configuration variables, parameter values fed to the RPCs) are preferably adjustable, and can be manually set by a user (e.g., through the initialization file), automatically determined (e.g., by the control tile, based on the device operation logic, etc.), or otherwise determined. Virtual representations of the available tile interfaces can be automatically populated in a programming environment in response to user addition of a respective tile to a virtual device within the programming environment, or be otherwise used.

In a first specific example, an imaging tile can include: an imaging system (e.g., camera), a communication bus module, on-board memory, and a processing system controlling imaging system, communication bus module, and on-board memory operation. The imaging tile can be associated with a set of configuration variables including: image size, sampling frequency, starting timestamp, and/or other variables. The imaging tile can be associated with a set of remote processing calls including: sampling an image, sending an image, comparing sequential images, and/or other functions. In an example, imaging tile operation can include: receiving a sampling RPC at the imaging tile, sampling an image with the image sensor in response to sampling RPC receipt, storing the sampled image in the on-board memory, and transmitting (e.g., to a communication bus) a tile output including a reference to the sampled image on the imaging tile (e.g., including the imaging tile identifier or address, an RPC identifier to send the image, and the image address on the on-board memory) to the control system.

In a second specific example, a temperature monitoring tile can include: a temperature sensor (e.g., thermistor), a communication bus module, and a processing system controlling temperature sensor and communication bus module operation. The temperature monitoring tile can be associated with a set of configuration variables including: temperature units (e.g., Celsius or Fahrenheit), sampling frequency, and/or other variables. The temperature monitoring tile can be associated with a set of remote processing calls including: sampling a temperature measurement and/or other functions. In an example, temperature monitoring tile operation can include: receiving a sampling RPC at the temperature monitoring tile, sampling the temperature with the temperature sensor in response to sampling RPC receipt, and transmitting (e.g., to a communication bus) a tile output including the temperature value to the control system.

In a third specific example, a communication tile can include: a wireless communication system (e.g., a cellular system), a communication bus module, and a processing system controlling wireless communication system and communication bus module operation. The communication tile can additionally include on-board memory that caches data for subsequent transmission. The communication tile can be associated with a set of configuration variables including: remote endpoint address, security key values, and/or other variables. The communication tile can be associated with a set of remote processing calls including: data transmission (e.g., wherein a reference to the data and/or where the data is stored can be received as an RPC parameter) and/or other functions. In an example, communication tile operation can include: receiving a transmission RPC at the communication tile, retrieving the referenced data in response to sampling RPC receipt, optionally caching the retrieved data in on-board memory, and transmitting the retrieved data to the endpoint identified by the remote endpoint address.

The control tile 200 of the modular system functions to control device operation. The control tile preferably functions as a centralized control system that coordinates operation of the device sub-components (e.g., functionality tile operation), but can alternatively function as a downstream processing system or perform any other suitable functionality. In one variation, the control tile can execute the device operation logic by calling the RPCs on connected functionality tiles (or itself) as specified by the device operation logic, managing tile output writing to the storage structure (s), monitoring the storage structure(s) for trigger events, executing the stream walkers to read values off the storage structure(s), and executing the processing functions associated with the trigger events in the device operation logic. Each device preferably includes a single control tile, but can alternatively include multiple control tiles. In the latter instance, each control tile can control a separate set of functionality tiles, or control overlapping sets of functionality tiles. The system can include a single control tile type or include multiple control tile types. In the latter instance, the control tiles can vary by processing power, amount of on-board memory, or otherwise vary. The control tile selected for inclusion in the device can be determined by the user (e.g., manually selected), automatically determined based on the device functionality tiles and the device operation logic (e.g., based on the computed resources required), or otherwise determined.

The control tile can include a processing system 210 and on-board memory 220. The control tile 200 can additionally include clocks, communication modules 230, sensors, or any other suitable component.

The processing system 210 of the control tile functions to perform the control tile functionalities discussed above. The control tile processing system can be the same as the functionality tile processing systems (e.g., have the same specifications, be the same chip line or type, etc.), be more powerful (e.g., have a faster clock rate, have more cores, have more processing power, etc.), be less powerful, or be otherwise related to the functionality tile processing systems. Examples of the processing system include CPUs (e.g., single core, multi-core, etc.), GPUs, microprocessors, or any other suitable processing system. The control tile preferably includes a single processing system but can alternatively include multiple, where tasks can be preassigned to different control tiles or automatically allocated (e.g., based on available resources).

The on-board memory 220 of the control tile functions as the memory for the entire device. In particular, the on-board memory functions as a central repository for all tile outputs. However, the on-board memory can store a subset of the tile outputs or perform any other suitable functionality. The size of the control tile memory is preferably limited, and can be smaller than the collective memory footprint of the functionality tiles, smaller than or less than a predetermined multiple of the amount of memory required to store all of the readings produced by any combination of tiles for the interval between connections to the remote computing system (e.g., 24 hours). The memory footprint of a tile can be the amount of memory required to store all data generated by the tile within a predetermined period of time (e.g., 24 hours, duration between scheduled wireless transmission events, etc.), the amount of memory that a tile uses or references while running (e.g., for function execution, measurement storage, etc.), or be otherwise defined. The collective memory footprint is preferably the aggregate memory footprint across all tiles in the device (e.g., amount of memory required to store all data generated by all tiles within a predetermined time, etc.), but can alternatively be the aggregate memory footprint of a tile subset, or be otherwise defined. However, the on-board memory can be otherwise sized. The size of the on-board memory can be fixed (e.g., standard for all devices), determined by the device operation logic and tile or RPC operation requirements, or otherwise determined.

The on-board memory 220 is preferably non-volatile (e.g., flash memory), but can optionally be volatile (e.g., RAM). The non-volatile memory preferably stores the initialization file, the device operation logic, and the tile outputs for all functionality tiles (e.g., readings, references to readings, errors, etc.), but can optionally store any other suitable information. The non-volatile memory can be unpartitioned; be partitioned into long-term memory (e.g., storing the initialization file, the device operation logic, etc.) and short-term memory (e.g., storing tile outputs or tile readings, tile errors, etc.); be partitioned to include mid-term memory (e.g., storing datum that needs to be retained for longer than a buffer cycle); be partitioned and assigned to individual tiles; or otherwise partitioned. The on-board memory preferably includes limited amounts of non-volatile memory (e.g., 2 MB, 4 MB, etc.), but can alternatively include large amounts of non-volatile memory (e.g., 2G). The volatile memory can store a list of tiles that have been initialized, values for the stream objects, addresses for the stream walkers, the tile outputs, or any other suitable information. The on-board memory preferably includes limited amounts of volatile memory (e.g., 32 kb, 64 kb, etc.), but can alternatively include large amounts of volatile memory (e.g., 2G).

The modular system 10 can optionally include a power source 600 that functions to supply power to the functionality tiles and control tiles of a device. The system can include a single power source option, multiple power source options (e.g., for different voltage ratings, different amperage circuits, portable or nonportable, different capacities, etc.), or any suitable number of power source options. The power source used in the device can be selected by a user, automatically selected based on the device operation logic and tile or RPC operation parameters, automatically selected using an optimization function, or otherwise determined. Examples of power sources that can be used include secondary batteries and the associated management circuitry (e.g., Li ion chemistry, NiCd chemistry, etc.), power grid adapters, or any other suitable power source.

The device can optionally include a communication channel that functions to transfer data between endpoints (e.g., tiles). The communication channel can also transmit power from the power source to the powered components of the device. The communication channel can be wired (e.g., be a data bus, leads in a circuit board, etc.) or wireless (e.g., be a local network hosted by the control system or other tile). However, power and data can be otherwise distributed across the device.

The storage structure 300 of the system 10 functions to store tile outputs. The storage structure preferably enables multiple processes to reuse the same tile output at different times and dynamically allocates memory between different tiles (e.g., based on need). However, the storage structure can be otherwise configured. The storage structure is preferably stored in the control tile memory (e.g., the non-volatile memory or volatile memory), but can alternatively be stored in a memory tile or in any other suitable memory.

Figure 5:
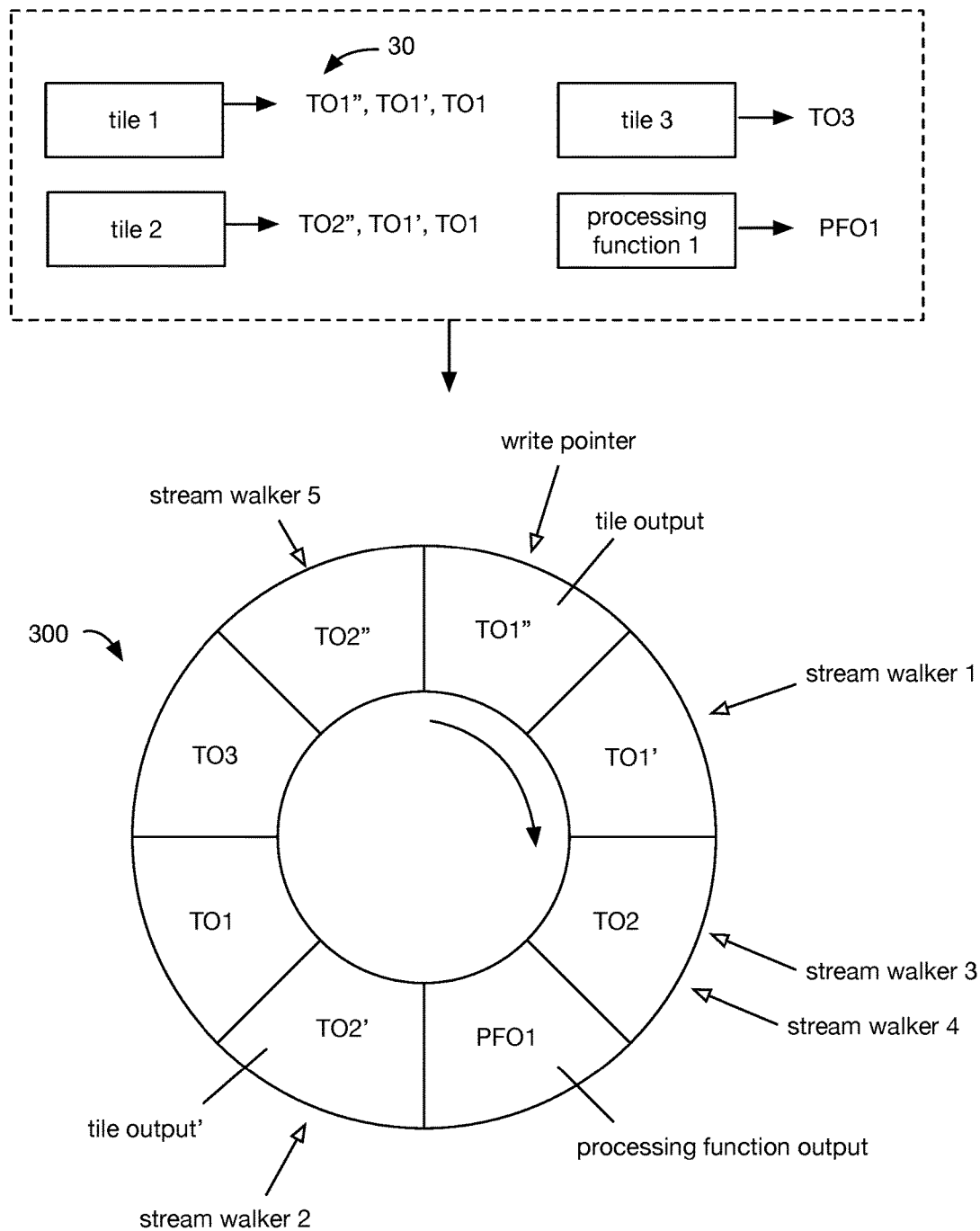
FIG. 5 is a schematic representation of an example of data stream generation using the device operation logic of FIG. 4 and the resultant storage structure.

The storage structure 300 preferably functions as centralized storage (e.g., global, universal, common across all tiles), and preferably stores all data streams (e.g., tile outputs, process function outputs, etc.) generated by the device tiles, an example of which is shown in FIG. 5. Alternatively, the storage structure can store tile outputs from a subset of the tiles in the device.

The storage structure 300 is preferably a circular buffer, but can alternatively be a variable-length buffer or be any other suitable buffer or have any other suitable structure. The storage structure is preferably a FIFO structure that writes data to the buffer in order of arrival (e.g., in time order), but can alternatively be a LIFO structure, LILO structure, FILO structure, or process data in any other suitable manner. While data in a FIFO circular buffer may eventually be overwritten by subsequent data entries, the inventors have discovered that some data loss is acceptable due to the high frequency nature of the data entries, and because the device applications do not require all the data for acceptable operation.

The data entries stored in the storage structure preferably have a fixed size (e.g., 32 bit, 64 bit per entry), but can alternatively have a variable size. The data entries can be tile outputs, processing function outputs, device errors, or any other suitable data. Tile outputs can include data indicative of the measurement sampled by the tiles (e.g., the measurement value itself, a reference to the measurement in tile memory, etc.), tile errors (e.g., high frequency errors, low frequency errors, etc.), or any other suitable tile output. The tile output can optionally include an identifier for the source tile (e.g., tile identifier), a data retrieval RPC identifier, or any other suitable information. The types of data stored in the storage structure can be user-determined (e.g., through the device operation logic), automatically determined, or otherwise determined. For example, high-frequency errors (e.g., packet loss) can be written to the storage structure when a user specifies that the high-frequency error is to be recorded, but low-frequency errors (e.g., device reset) can be automatically written to the storage structure. Alternatively, manufacturer-related errors, such as hardware or tile runtime errors, can always be written to the storage structure (e.g., wherein the errors are packaged and sent to the remote computing system when the user-desired data is sent). This can enable remote device health monitoring, remote tile debugging, and remote tile testing.

The modular system can optionally include a stream object (e.g., streamer) that functions to monitor one or more data streams 30 within the storage structure for a trigger event. The stream object can alternatively monitor a stream walker, or any other suitable virtual construct. In a first variation, the stream object is a counter that counts the number of entries from a given data stream and triggers a downstream processing function when a predetermined number of entries is determined. In a second variation, the stream object is a monitor that triggers a downstream processing function when a predetermined number of entries is encountered. However, the stream object can look for any other suitable trigger condition.

Each stream object is preferably associated with a data stream. In variants where multiple data streams are mixed in a single storage structure, the stream object can be associated with an output condition characterizing the data stream. Examples of the output condition include an output type, a measurement type, a source tile ID, an entry generation time, a combination of the above, or any other suitable condition. Each data stream can be associated with one or more stream objects. Each stream object can additionally be associated with a processing function, wherein the stream object triggers processing function execution upon trigger event occurrence. The stream object is preferably executed by the control tile, more preferably the processing system of the control tile, but can alternatively be executed by an initialization tile or by any other suitable processing system. The stream object values (e.g., count value) can be stored in volatile control tile memory, non-volatile control tile memory, or otherwise stored.

The modular system can optionally include one or more virtual stream walkers (reading modules) that function to traverse the storage structure and remember a parameter about data entries that satisfy a predetermined output condition. In other words, a stream walker can traverse the universal buffer, pick out a specific tile output stream, and track a parameter of the tile output stream for use in a subsequent processing function in the device logic, example shown in FIG. 6. The stream walkers can be specific to each tile output—processing function combination. For example, if multiple processing functions use the same tile output stream as an input, the device can maintain multiple stream walkers (e.g., one per processing function) for the tile output stream, each walking through the buffer at different paces (e.g., because the different processing function are triggered at different times). If a processing function takes multiple data streams as inputs, the device can maintain multiple stream walkers for that processing function, each monitoring its own data stream within the storage structure. However, the device can alternatively include a stream walker for each tile output, a stream walker for each processing function (e.g., wherein the stream walker can monitor multiple tile output streams), or include any other suitable number of stream walkers. The stream walkers are preferably automatically generated based on the device operation logic, but can alternatively be manually specified.

Stream walkers can be read-only, such that the underlying data entry remains intact within the storage structure for subsequent use by another processing function. This allows the source tiles to be decoupled from the downstream processes that use the tile outputs. Alternatively, the stream walkers can read the data and delete the read data from the storage structure, change the data entry, or otherwise interact with the data entry. The stream walker is preferably executed by the control tile, but can alternatively be executed by any other suitable processing system.

A stream walker can be executed when a trigger event occurs (e.g., as determined by the stream object). When a device (e.g., control tile) executes a stream walker, the stream walker starts at the last position it read in the storage structure, and increments through each sequential position in the storage structure until it encounters the next data entry satisfying the output condition. The stream walker then reads the entry (e.g., to RAM, to the processing function using the entries, to the storage structure, etc.) and repeats the process until the buffer is exhausted or a stop condition is met (e.g., a predetermined number of readings have been read). The stream walker then stores a pointer to the storage structure position where it stopped reading. However, the stream walker can operate in any other suitable manner.

Data entry parameters that can be determined by a stream walker include: the measurement's value, the entry's position or address within the storage structure, the number of entries satisfying the output condition, or any other suitable parameter. In a first variation, the stream walker counts the number of data entries within the storage structure satisfying the output condition. In a second variation, the stream walker determines the most recent entry satisfying the output condition (e.g., by overwriting the value stored by the stream walker each time a subsequent entry is encountered). In a third variation, the stream walker can read the entry value.

The predetermined output condition can be an output type, a measurement type, a source tile ID, an entry generation time, a combination of the above, or any other suitable condition. For example, a first stream walker can look for temperature measurements, while a second stream walker can look for temperature measurements from a specific tile. Each stream walker preferably reads data entries of a single type (e.g., associated with a single output condition), but can alternatively read multiple data entry types (e.g., each associated with a different output condition). The output condition is preferably automatically determined based on the device operation logic, more preferably based on the tile output (or RPC generating the tile output) to be fed into a downstream processing function defined in the device operation logic, but can be otherwise determined.

The initialization file 400 of the device functions as centralized source of truth for device operation, which can confer easy in-situ device reconfiguration. This can also confer easy device prototyping; when a new functionality tile is added to a prototype device, a user only needs to add the values for the new tile to the initialization file for the tile to be operable. Each device preferably includes a single initialization file, wherein the initialization file is preferably paired with the device operation instructions, but can alternatively include any suitable number of initialization files. The initialization file is preferably stored by the control tile, more preferably the non-volatile memory of the control tile but alternatively by any other suitable memory. The initialization file can be stored on the device during manufacture, be updated remotely, or otherwise defined.

The initialization file 300 preferably stores operation settings for each tile of the device. The operation settings preferably include the configuration variable values for each tile, but can alternatively include the remote processing calls that will be used during device operation for each tile, the call frequency, or any other suitable information. In one variation of device operation, each tile receives its respective operation settings from the initialization file upon device initialization, prior to individual tile initialization. In one embodiment, each tile will not initialize until the respective operation settings are received (e.g., each tile can prevent tile initialization until it receives at least the required configuration variable values from the initialization file). Alternatively, each tile can be initialized using operation settings stored on the tile, using past operation settings, using default settings, or using any other suitable set of settings. In a first variation, the operation settings for all tiles can be broadcast to all tiles in the device, where each tile reads its respective operation settings off the communication channel. In a second variation, the tiles each request or retrieve the respective operation settings from the control tile. However, the operation settings can be otherwise sent to the respective tiles.

The device operation logic 500 (operation instructions, sensor graph) of the device functions to define the functionality of the overall device by stitching the functionalities of multiple, disparate nodes (here, the tiles) together into a cohesive whole. The device operation logic, combined with the initialization files, control operation of the tiles. The device operation logic can define which tiles are operated, which RPCs on the tiles are called (e.g., all or a subset of the RPCs defined for the tile population), when the RPCs are called, and which, when, and how the resultant data streams are processed. For example, the device operation logic can determine how sensor readings are processed, when communication modules are woken up for transmission, what data is sent, when error conditions trigger out-of-band notifications, when output tiles should be operated, and/or how output tiles should be operated. The device operation logic can optionally determine when sensor readings are taken; alternatively, the sensor readings can be taken at a predetermined frequency (e.g., set by the respective configuration variable or predetermined by the tile manufacturer). While the device operation logic controls inter-tile interactions (e.g., when tiles are operational, which tile RPCs are called, how tile outputs are processed), the device operation logic preferably does not change the tile's operation logic or internal functions. Alternatively, the device operation logic can reconfigure the tile's operation logic or internal functions.

The device operation logic 500 can include virtual representations of the functionality tiles of the device, virtual representations of the data streams (e.g., tile outputs), virtual representations of the trigger events, and virtual representations of processing functions. The processing functions function to process the values of one or more data streams into processing function outputs (e.g., derivatory data), which can be written to the storage structure, written to volatile control tile memory, or stored in any other suitable location. The processing function outputs can be used by subsequent processing functions in the device operation logic, or be transmitted to the remote computing system, or otherwise used. The processing functions can be predefined (e.g., standard functions, such as adding, averaging, etc.), user-defined (e.g., written by a user), or otherwise defined. Each edge can be associated with an output of the parent node (e.g., tile output, processing function output, etc.), with a trigger event (e.g., controlling when the output should be provided to the child node), and/or with any other suitable information.

The device operation logic is preferably entirely or partially stored on the device (e.g., on the control tile, on the control tile memory, on an initialization tile, etc.), on the remote computing system, or on any other suitable system.

The device operation logic is preferably a graph data structure, but can alternatively be a stack data structure, map data structure, queue data structure, or any other suitable data structure. The graph data structure can be traversed using a depth-first search, breadth-first search, or be traversed in any other suitable manner. Alternatively, the device operation logic can be stored as a NoSQL database, more preferably a graph database, but can alternatively be a relational database, an object database, tabular database, Tuble store database, RDF database, multimodel database, an object-oriented database, a document-oriented database, a NewSQL database, a linked data database, or be any kind of semantic query construct. The device operation logic can be coded (e.g., using programming syntax), generated using a visual programming system (e.g., by creating a state diagram), or otherwise generated.

When the device operation logic is a graph data structure (example shown in FIG. 4), the graph data structure can include a set of nodes and a set of edges, each edge connecting a parent node to a child node. The nodes can include tile nodes representing functionality tiles, processing function nodes representing processing functions, or any other suitable set of nodes. Each tile node can be associated with a set of operation settings (e.g., configuration variables), a tile output (e.g., and/or an RPC call that produces the output) or a tile input (e.g., for output tiles), or with any other suitable set of data.

The graph data structure can include both device operation logic and remote operation logic (e.g., include both processes to be performed on the device and processes to be performed by the remote computing system). Alternatively, the graph data structure can include only device operation logic. Device operation logic can include the processes to be performed on the device, while remote operation logic can include processes requiring inputs from a single device, processes requiring inputs from multiple devices (e.g., fleet-wide analyses), processes requiring large processing resources, or any other suitable set of processes.

In one variation, the device can be associated with a master graph data structure including both device and remote operation logic, where only the device portion of the operation logic is stored on the device. In operation, the device executes the graph data structure up to the division between the device operation logic and the remote operation logic and transmits the parent node outputs to the remote computing system, wherein the remote computing system performs the remainder of the graph data structure. The division can be user-determined, automatically determined, or otherwise determined. The edges at which the division(s) are located can be edges upstream of resource-intensive processing functions (e.g., electric power, processing power, etc.), edges having minimal bandwidth requirements (e.g., because bandwidth can be expensive), edges that minimize downstream on-device power consumption, edges that minimize downstream value storage, edges that optimize a set of parameters (e.g., processing power, power consumption, bandwidth, etc.), or be any other suitable set of edges. In an embodiment of the first variation, portions of the graph data structure can overlap between the device and remote portions, such that both the device and the remote computing system can perform the same operation logic. In this embodiment, operation logic execution can be dynamically reallocated between the device and the remote computing system. In an example, the device can perform portions of the logic typically performed by the remote computing system when the device cannot connect to the remote computing system after a threshold number of attempts, or when any other suitable event is met. However, operation logic performance can be otherwise reallocated. In a second variation, the entire master graph data structure is stored on the device. In a third variation, the device is associated with a device graph data structure and a remote graph data structure, where only the device graph data structure is stored on the device. However, the operation logic can be otherwise divided and stored.

The graph data structure can be written, programmed using visual programming, or otherwise created. For example, the graph data structure can be created in a visual programming environment. In this example, the visual programming environment can receive a first node selection associated with a functionality tile, receive a second node selection associated with the processing function (e.g., a virtual process on the control tile configured to execute the processing function); receive a transition (or edge) extending from the first node to the second node; receive a tile output selection in association with the transition; and receive a transition trigger event in association with the transition, where a series of such chains cooperatively form the graph data structure. However, the graph data structure can be otherwise generated. Alternatively, the graph data structure (or other form of device operation logic) can be generated using a set of blocks (e.g., representing tiles, nodes, and/or processing functions), icons, or any other suitable set of visual programming components.

The graph data structure can be used to automatically generate other system components. In one variation, a stream object can be generated for each trigger event associated with the edges, wherein the output condition associated with the stream object can be determined from the parent node output and the downstream process triggered by the stream object can be the process represented by the child node connected to the edge. In a second variation, a stream walker can be generated for each edge, wherein the output condition associated with the stream walker can be determined from the parent node output and the stream walker endpoint can be the process represented by the child node connected to the edge. In a third variation, an initialization file can be generated from the operation settings assigned to the tile nodes. In a fourth variation, a list of RPCs to be called can be generated from the tile outputs associated with the edges. In a first embodiment of the fourth variation, the list of RPCs can be included in the initialization file, where the tiles can automatically generate tile outputs without further control tile intervention. In a second embodiment of the fourth variation, the RPCs are linked to the stream objects, where the control tile calls the RPC upon occurrence of the respective trigger event.

The graph data structure can be used simulate device operation, which functions to determine specifications for the physical device and/or identify performance constraints without device prototyping and physical testing. For example, the graph data structure can be used to determine the power requirements for the device, the memory requirements for the device, the runtime for the device, or determine any other suitable device performance parameter. This is possible because each tile's operation parameter values (e.g., RPC operation parameter values, standby operation parameter values) are known. In one example, the simulation environment can determine branches of the graph data structure that could be run concurrently, calculate the amount of resources required to run each of the identified branches, determine the maximum resources required to run the identified branches (e.g., by adding up the required resources for all potentially concurrent branches), and determine whether the selected resources (e.g., power source and control tile) can support (e.g., exceed) the maximum resources required. In response to determination that the required resources exceed the device resources, the system can automatically generate a notification warning the user that the device resources may be insufficient, automatically generate a recommendation for replacement components, automatically select replacement components (e.g., a control tile with more memory, a power source with a higher rating or capacity, etc.), automatically identify edges or nodes that can bring the resource requirements within the available device capabilities, or perform any other suitable function. In a second example, the simulation environment can determine the runtime for each branch of the graph data structure and estimate the amount of time required for a given output to be generated (e.g., based on the runtime of each upstream branch of the output). However, the simulation can be otherwise used.

4. Method.

Figure 4:
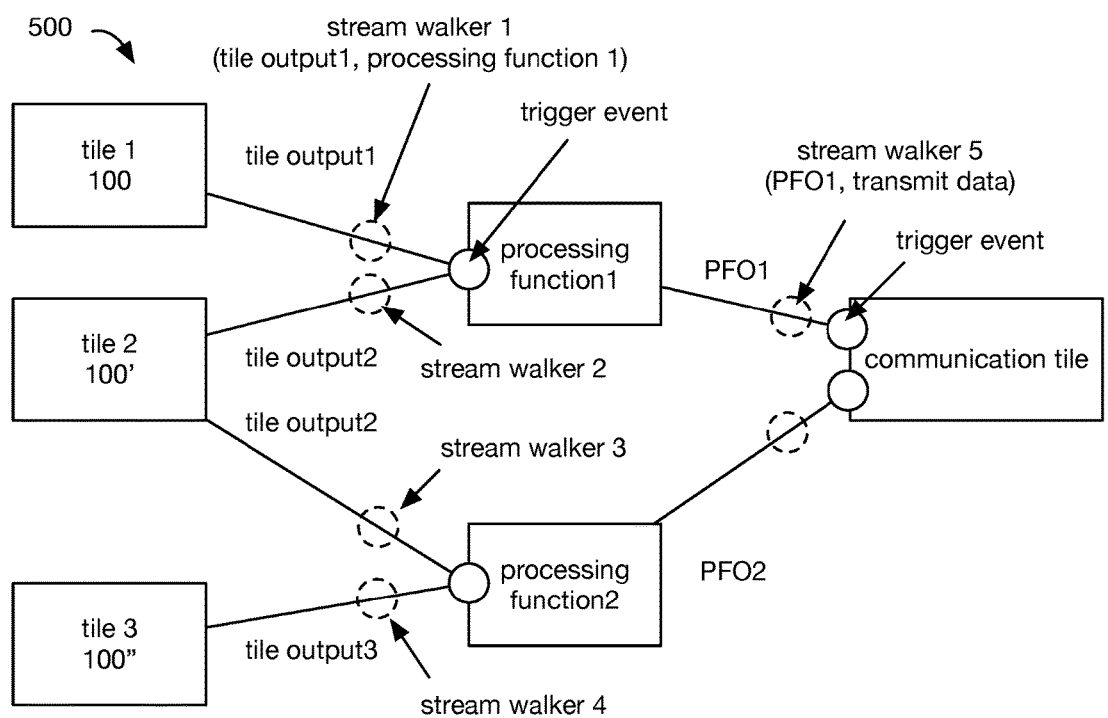
FIG. 4 is a schematic representation of an example of device operation logic.

As shown in FIG. 4, the method for operating a custom device can include: populating a control system with operation instructions S100; sending operation settings for each tile to the respective tile upon device initialization S200; operating each tile S300; writing the output from each tile to the storage structure S400; monitoring data streams within the storage structure for a trigger event S500; reading data off the storage structure in response to occurrence of the trigger event S600; and processing the read data according to a processing function S700. The method can optionally include sending data to a remote computing system S800. The method functions to provide sufficient flexibility to operate a plurality of different custom devices using completely different operation logic.

The method is preferably performed by a device created using the modular system discussed above, but can alternatively be performed by any other suitable device.

Populating a control system with operation instructions S100 functions to provide operation instructions to the device. The control system is preferably centralized (e.g., wherein the entire device is controlled by a single control system), but can alternatively be distributed across multiple control systems. The control system is preferably a control tile, but can alternatively be any other suitable control system. The operation instructions can include: operation settings (e.g., configuration variable values), the initialization file, operation logic (e.g., graph data structure for the device), or any other suitable set of instructions. The operation instructions is preferably stored by the on-board memory of the control system, but can be stored on a separate tile (e.g., an initialization tile from which initialization and/or device operation information is read), or be stored on any other suitable system. The control system can be populated with operation instructions by the manufacturer, by the remote computing system (e.g., when remotely updating the device with new operation logic), by a user device (e.g., a smartphone connected to the device), or by any other suitable system. The control system can be populated at the manufacturing facility, in-situ (e.g., in the field), or populated in any other suitable manner. In one variation, the method can include: receiving a device operation change from a user account at a computing system, generating an updated operation logic based on the device operation change, and overwriting the device operation logic stored on the control tile with the updated operation logic. The device operation change can include: adding a new tile to the device (and adding the respective operation settings to the initialization file); new device operation logic, or any other suitable device operation change.

Sending operation settings for each tile to the respective tile upon device initialization S200 functions to configure the functionality tiles. Device initialization can be: the first time the device is ever turned on with a specific set of operation instructions, each time the device is turned on, each time the device (e.g., the control system) switches from a standby state to an operational state, or be otherwise defined. Sending the operation settings can include: broadcasting the operation settings onto a communication channel (e.g., a bus or local network), receiving an operation settings request from each respective tile and returning the respective operation settings, or otherwise sending the operation settings. The operation settings are preferably automatically sent upon detection of an initialization event (e.g., power supply to the device, power supply to the control tile, determination that a switch has been flipped, etc.), but can alternatively be sent upon the occurrence of any other suitable event. The operation settings are preferably sent by the control tile (e.g., retrieved from the initialization file), but can alternatively be sent by an initialization tile (e.g., wherein the initialization tile handles device initialization while the control tile controls device operation thereafter) or be sent by any other suitable component. The operation settings can include: configuration variable values (e.g., required and/or default), RPCs, RPC call frequencies, or values for any other suitable setting.

The tile, more preferably the tile processor by alternatively another tile control system, preferably prevents tile initialization (e.g., tile operation, tile operation switch from a standby state to an operational state) until the respective operation settings are received. The tile is preferably initialized and operated using the respective operation settings after receipt (preferably by the tile processor but alternatively by another tile control system), but the operation settings can be otherwise used. This can prevent tiles from operating with insufficient information about the rest of the device. However, the tile can be initialized and operated using default values (e.g., stored by the tile, stored by the initialization file, etc.) until the operation settings are received, or operated in any other suitable manner.

Operating each tile S300 functions to generate device inputs, which can be subsequently processed by the device logic. The tiles are preferably operated using the respective operation settings, but can be otherwise operated. Tile operation control is preferably split between the control system and the tile itself, but device operation can alternatively be centralized at the control system (e.g., wherein the control system controls the tile subsystems), distributed across the tiles (e.g., wherein each tile can store and perform a portion of the device operation logic), or otherwise distributed.

Figure 8:
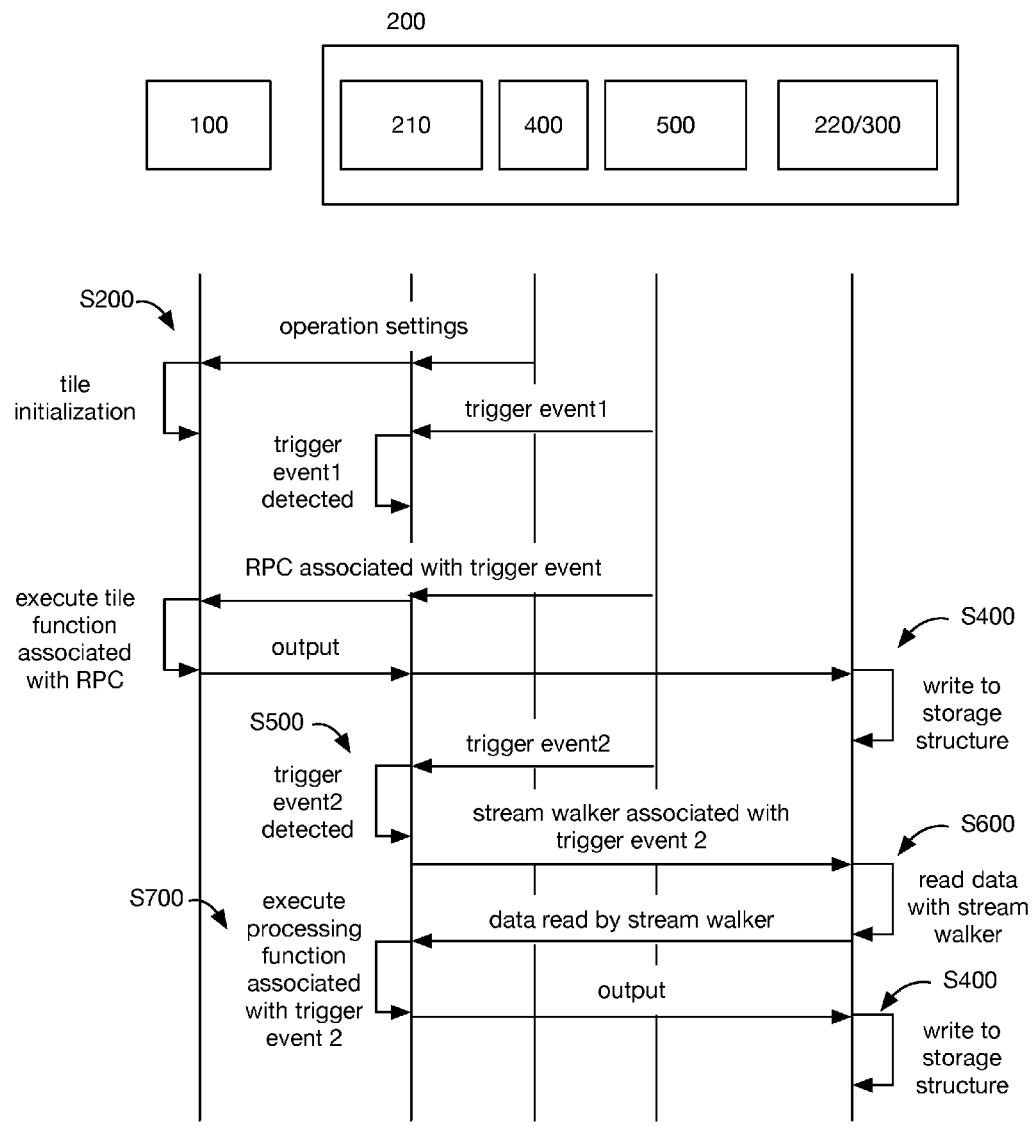
FIG. 8 is a schematic representation of an example of device operation, including operating the tiles according to the device operation logic and storing the tile output in the storage structure.

In a first variation, the control system determines which RPCs to call and when to call said RPCs based on the device operation logic, and calls the RPCs when the associated trigger event occurs (e.g., by sending the RPC call to the associated tile through the shared communication channel), an example of which is shown in FIG. 8. The tile associated with the RPC receives the RPC call, internally identifies the tile function (e.g., code block) referenced by the RPC, performs (e.g., executes) the tile function, and outputs a tile output value generated by the tile function (e.g., to the shared communication channel).

In a second variation, the tile automatically executes a tile function and outputs a tile output value generated by the tile function (e.g., to the shared communication channel). The tile function can be automatically executed at a predetermined frequency, in response to an execution event being met, or at any other suitable time. The predetermined frequency can be a default frequency, set by the initialization file (e.g., through a parameter of the associated RPC, through a configuration variable), or otherwise determined. The execution event can be an external event (e.g., tile receipt of a command or input from an external control system), an internal event (e.g., a time threshold being met, a sensor output substantially matching a predetermined value, etc.), or be any other suitable event. However, the tile can be otherwise operated.

Writing the output from each tile to the storage structure S400 functions to store (e.g., cache) the tile outputs for subsequent use. The output is preferably written by the control tile to the storage structure, but can be written by the source tile or by any other suitable system. The output is preferably read off the communication channel and stored in the storage structure, but can be otherwise transferred to the storage structure. The storage structure is preferably stored by the control system (e.g., the control tile), more preferably by the on-board memory of the control system (e.g., the nonvolatile memory) but alternatively by a storage tile or by any other suitable storage system. The storage structure is preferably a common buffer (e.g., a circular buffer, a FIFO buffer, etc.) that stores the tile outputs from all functionality tiles, but can alternatively be a buffer specific to a given functionality tile.

Monitoring data streams within the storage structure for a trigger event S500 functions to determine when a subsequent processing function should be executed. The storage structure is preferably monitored by a virtual monitor (e.g., a stream object) executed by the control system (e.g., by the control tile processor), but can alternatively be monitored by the source tile, by the system storing the storage structure, or by any other suitable component. The monitored data stream and trigger event are preferably specified by the device operation logic, but can be otherwise specified. In a variation in which the device operation logic is a graph data structure, the data stream can be the tile output associated with an edge of the graph data structure, and the trigger event can be the event associated with the edge and/or the child node connected to the edge. However, the data stream and trigger event can be otherwise defined.

Reading data off the storage structure in response to occurrence of the trigger event S600 functions to determine the input values for a processing function. The data read off the storage structure is preferably data from the monitored data stream (e.g., a data stream specified as an input to a processing function by the device operation logic), but can alternatively be any other suitable data. The data is preferably read off the storage structure with a stream walker (e.g., reading module) executed by the control system (e.g., by the control tile processor), but can alternatively be read by the source tile, by the system storing the storage structure, or by any other suitable component. The stream walker is preferably associated with a data stream. More preferably, the stream walker is associated with a set of output conditions (e.g., data type, source tile ID, etc.) that characterize the data stream the stream walker is to read, but can be otherwise defined. When the storage structure is a graph data structure, the output conditions can be defined by the edge of the graph data structure (e.g., the data passed by the edge), the RPC that generates the data passed by the edge, the parent node, or otherwise defined. The stream walker can additionally be associated with a stream object (e.g., wherein the stream object triggers stream walker operation in response to occurrence of the associated trigger event), a processing function (e.g., that takes the stream walker outputs as inputs), or any other suitable construct. Each stream walker is preferably associated with a single edge, stream object, and/or processing function, but can alternatively be associated with any suitable number of the above.

The data is preferably only read off the storage structure (e.g., wherein the data is not modified by the stream walker), but can alternatively be removed from the storage structure, be edited within the storage structure, or otherwise managed. The values of the read data (or parameters thereof) can be stored in volatile memory, stored in a different partition of the memory storing the storage structure, stored in the storage structure (e.g., wherein a second stream walker can track the values output by the first stream walker), or otherwise stored. Subsequent processing functions can then consume the stream walker output without affecting the values stored in the storage structure. This can allow multiple functions to utilize the same data streams at different times.

In a first variation, the data is read from an end of the storage structure (e.g., from the beginning or end of the buffer). In this variation, the storage structure is preferably specific to the data stream (e.g., specific to the tile output), but can alternatively be global (e.g., shared across multiple tiles).

Figure 6:
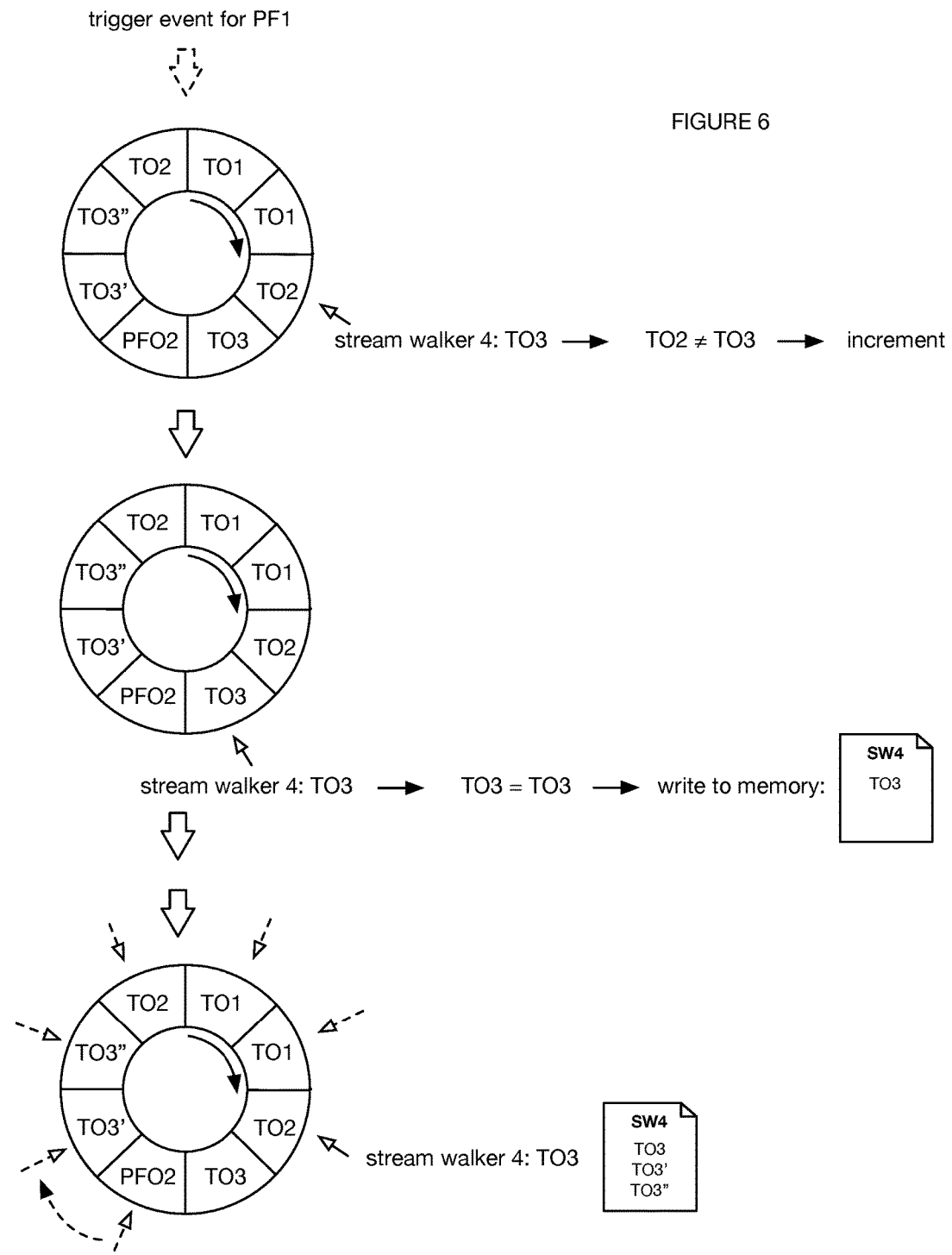
FIG. 6 is a schematic representation of reading data off the storage structure with a stream walker.
Figure 7:
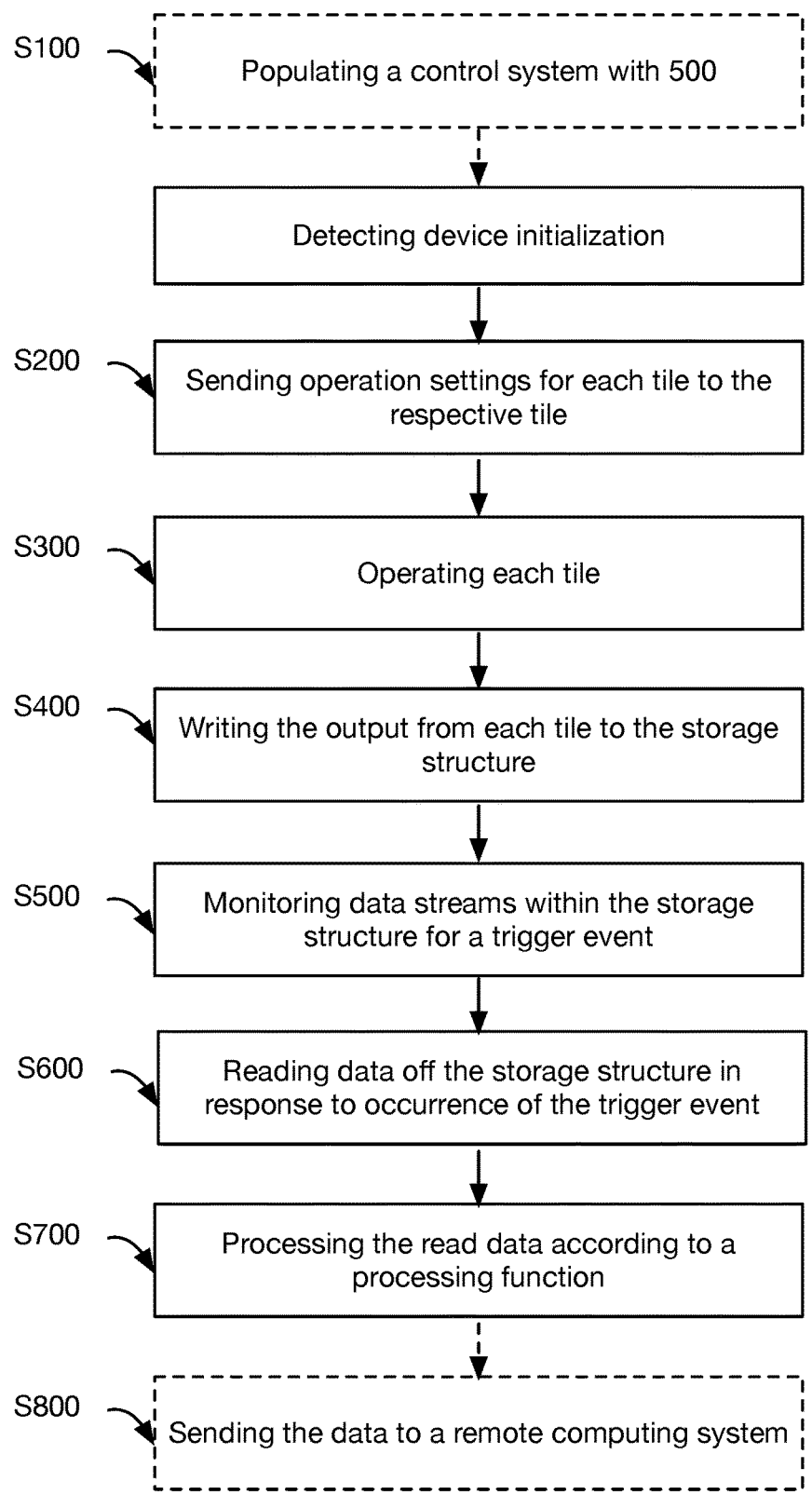
FIG. 7 is a schematic representation of the method.

In a second variation, the stream walker incrementally steps through each piece of data in the storage structure, determines whether the current piece of data meets the output conditions, skips the current piece of data if the data does not satisfy the output conditions, and acts on the current piece of data when the data does satisfy the output conditions, example shown in FIG. 6. Acting on the current piece of data can include: copying the data off the stream, counting the number of data entries satisfying the output condition, determining a data state (e.g., true or false), or otherwise acting on the data. The stream walker can begin at the last position it analyzed (e.g., read, considered, etc.) within the storage structure, begin at a predetermined position in the storage structure (e.g., a specific address, the beginning, the end, etc.), or begin at any other suitable position within the storage structure. The stream walker can stop reading when a termination event is met. The termination event can be: a predetermined number of data readings being met, a time threshold being met, a determination that there are no new entries in the data stream, or any other suitable termination event.

When data values are stored on auxiliary storage (e.g., stored outside the storage structure), the method can additionally include retrieving the data value from the auxiliary storage. This can be particularly useful for large measurements (e.g., measurements exceeding the data size limit for storage structure entries), but can be used for small measurements (e.g., measurements falling within the data size limits for storage structure entries) as well. When data values are stored on auxiliary storage, the storage structure functions as a tracker that tracks whether a measurement has been added to the data stream stored on the auxiliary storage). In particular, the storage structure can store a reference to the data and/or data stream stored on the auxiliary storage, where the reference can include: a tile identifier and data retrieval information. The data retrieval information can include: a retrieval RPC call for the tile, an identifier for the data within the auxiliary storage, and/or any other suitable information. The data value can be retrieved by the control system (e.g., by the control tile processor), but can alternatively be retrieved by the source tile, by the system storing the storage structure, or by any other suitable component. The retrieved data can be treated as the stream walker output, or be otherwise treated.

Processing the read data according to a processing function S700 functions to transform the data streams into derivatory data. This can function to extract useful information from the data streams (e.g., trends, averages, relationships, etc.), which can be useful when the data streams include a large amount of high-frequency data. This can further function to reduce the amount of data eventually sent to the remote computing system, thereby reducing bandwidth costs. The data is preferably processed in response to occurrence of the trigger event, more preferably after the data has been read off the storage structure but alternatively at any other suitable time. The data can be processed as the stream walker reads the data values off the storage structure, processed after the stream walker is done reading the data values off the storage structure, or at any other suitable time. The data is preferably processed by the control system (e.g., by the control tile processor), but can alternatively be processed by the source tile, by the system storing the storage structure, or by any other suitable component. The data is preferably processed based on the processing function associated with the trigger event (e.g., the child node of the edge associated with the trigger event), but can alternatively be processed in any other suitable manner. The output of the processing function (processing function output) is preferably written to the storage structure, more preferably the common buffer but alternatively a separate storage structure partition specifically assigned to the processing function, but can alternatively be written to auxiliary storage, sent to the remote computing system, or otherwise stored.

The processing function output is preferably treated as another data stream, but can alternatively be treated in any other suitable manner. For example, when the device operation logic includes a secondary processing function that takes the processing function output as an input, the method can additionally include repeating S500 for a second trigger event associated with the secondary processing function, repeating S600 with a stream walker configured to read the processing function output from the storage structure in response to second trigger event occurrence, and repeating S700 with the secondary processing function. However, the processing function output can be otherwise used.

The method can additionally include sending data to a remote computing system S800. The data is preferably sent by a communication system (e.g., communication tile) of the device, but can alternatively be sent by the control tile or by any other suitable tile of the device. The remote computing system is preferably a remote server system (e.g., identified by a universal resource identifier stored by the device), but can alternatively be a user device (e.g., smartphone) connected to the device (e.g., via NFC, Bluetooth, WiFi, or another external communication channel), or be any other suitable remote endpoint. The data is preferably sent in response to the occurrence of a transmission event, but can alternatively be sent at any other suitable time. The transition event can be a trigger event (e.g., monitored as discussed in S500, but alternatively otherwise monitored), a resource event (e.g., wherein a resource monitoring process on the control system monitors system resource parameters, such as amount of memory left, the battery state of charge, etc.), or be any other suitable event.

Sending data to the remote computing system is preferably controlled and coordinated by the control system of the device (e.g., the control tile), but can alternatively be partially or entirely controlled by the communication system. In a first example, the control system can determine that a trigger event associated with remote data transmission has occurred, initiate data reading off the storage structure, and send an RPC to the communication tile to transmit the read data (e.g., with an identifier for the read data), wherein the communication tile receives and transmits the read data in accordance with the RPC. In a second example, the control system can determine that a transmission event associated with remote data transmission has occurred and send an RPC to the communication tile to transmit a data stream, wherein the communication tile controls data extraction from the storage structure and data transmission to the remote computing system. In a third example, the control system can determine that a transmission event has occurred, send an RPC to the communication tile to begin reading data for transmission off the communication channel (e.g., also including data identifiers, such as source tile IDs), and send an RPC to the source tile storing the data (e.g., the tile storing the data on auxiliary storage, the tile supporting the main storage structure, etc.) to begin streaming the specified data onto the communication channel, where the communication tile automatically reads and transmits the data off the communication channel. However, data transmission to the remote computing system can be otherwise controlled.

Sending data to the remote computing system can include reading data values off the storage structure, caching the data values in temporary storage, sending the data values to the communication system, and sending the data to the remote computing system from the communication system. However, data can be otherwise sent to the remote computing system.

Reading the data values functions to filter the storage structure for the data stream to be sent to the remote computing system. The data is preferably read off the storage structure in the manner discussed in S600, but can alternatively be read by the communication system (e.g., wherein the communication system can include a reading module specific to the type of data to be transmitted), or be read in any other suitable manner. The data values can be read off the storage structure at a predetermined frequency, in response to transmission event occurrence, after the control system has sent a transmission command (e.g., a transmission RPC) to the communication system, in response to receipt of the transmission command from the control system, as the data stream is being generated, or at any other suitable time.

Figure 9:
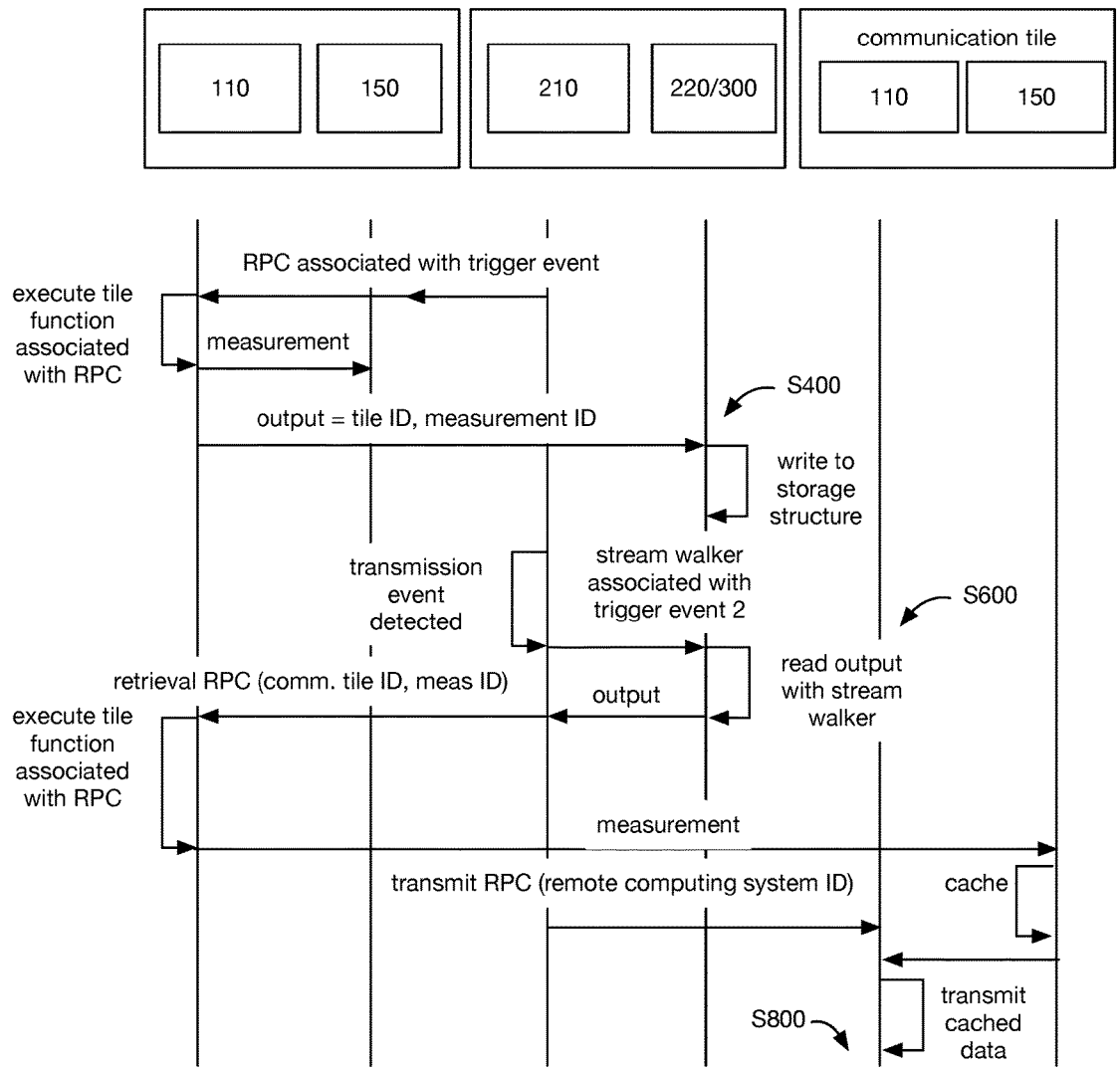
FIG. 9 is a schematic representation of an example of device operation, including recording measurements exceeding the storage structure data size limit and transmitting said measurements.

When the data value includes a reference to data in auxiliary storage (e.g., for large measurements), the data values can be read directly from auxiliary storage to the communication system. In a first variation, example shown in FIG. 9, reading the data values can include: reading the reference off the storage structure (e.g., with the control system); and, in response to occurrence of the transmission event, sending an retrieval RPC to the auxiliary storage (e.g., to the tile with the auxiliary storage) with the reference and an address of the communication system (e.g., a communication tile identifier). The auxiliary storage can then send the data directly to the addressed communication system, bypassing the control system memory. In a second variation, reading the data values can include: reading the reference off the storage structure (e.g., with the control system) and sending all or part of the reference to the communication system (e.g., as a parameter of a communication tile RPC call). The communication system can then retrieve the data value from the auxiliary storage using the reference by using a retrieval RPC call for the tile with the auxiliary storage or requesting the data in any other suitable manner. However, data stored in auxiliary storage can be otherwise transferred to the communication system.

Caching the data values functions to temporarily store the values to be sent. This can be particularly useful if the connection to the remote computing system is unreliable. In a first variation, the data values can be cached in the same storage medium as data values for processing functions (e.g., copied to the storage medium), wherein the communication system can read the data values off the storage medium when needed. In a second variation, the data values can be cached in communication system memory (e.g., copied to the communication system memory). In this variation, the data values can be read off the storage structure into the communication channel, wherein the communication system reads the data off the communication channel and writes the data in communication system memory. The communication system memory can be volatile (e.g., RAM) or nonvolatile (e.g., flash). In a third variation, the storage structure functions as the cache. In this variation, the method can include determining addresses for the data within the storage structure and sending the addresses to the communication system, wherein the communication system reads the data values off the storage structure using the addresses during transmission to the remote computing system. However, the data or identifier thereof can be cached to in any other suitable manner. Caching the data can additionally include packaging the data, compressing the data, securing the data (e.g., with a security key), or otherwise processing the data.

Sending the data values to the communication system functions to transfer the data values from the cache to the communication system for transmission. The data values can be sent to the communication system before occurrence of the transmission event, after occurrence of the transmission event, in response to the control system sending a transmission command (e.g., a transmission RPC) to the communication system, in response to receipt of the transmission command from the control system, in response to establishment of a communication channel with the remote computing system, or sent at any other suitable time. The data values are preferably sent over the communication channel (e.g., bus), but can alternatively be otherwise sent.

Sending the data values from the communication system to the remote computing system functions to communicate data, generated by the device, to an external source. Sending the data values can include: connecting to the remote computing system using a remote computing system identifier (e.g., a URI) and transmitting the data values to the remote computing system. When a connection cannot be established or was interrupted, the method can include re-attempting transmission until the data is sent or a threshold number of attempts have been made. Transmission re-attempts are preferably controlled by the communication system (e.g., by the processor of the communication tile), but can alternatively be controlled by the control system (e.g., the control tile) or by any other suitable control system.

Embodiments of the system and/or method can include every combination and permutation of the various system components and the various method processes, wherein the method processes can be performed in any suitable order, sequentially or concurrently.

As a person skilled in the art will recognize from the previous detailed description and from the figures and claims, modifications and changes can be made to the preferred embodiments of the invention without departing from the scope of this invention defined in the following claims.

I claim:

1. A method for device operation, the device including a control tile connected to a plurality of tiles physically distinct from the control tile, the method comprising:
   populating a control tile with operation instructions for the device, the operation instructions comprising operation settings for each of the plurality of tiles;
   sending the operation settings to the respective tiles upon each device initialization, wherein each tile prevents operation of the respective tile until the respective operation settings are received;
   operating each tile of the plurality based on the respective operation settings;
   writing tile output values from the tiles into a common circular buffer stored by the control tile in order of arrival;
   monitoring the circular buffer for a trigger event with a virtual monitor executed by the control tile;
   incrementally stepping through the circular buffer with a reading module that selectively reads the tile output values satisfying a tile output parameter associated with the trigger event; and
   processing the tile output values read by the reading module according to a processing function associated with the trigger event.

2. The method of claim 1, wherein a tile of the plurality further comprises non-volatile tile memory, wherein each piece of data stored within the circular buffer has a fixed size, wherein operating the tiles comprises:
   sampling a measurement exceeding the fixed size; and storing the measurement within the non-volatile tile memory;

wherein the tile output value comprises a tile identifier for the tile, a remote processing call identifier for the tile, and a measurement identifier for the measurement, wherein processing the tile output values comprises retrieving the measurement from the non-volatile tile memory based on the tile identifier, the remote processing call identifier, and the measurement identifier.

3. The method of claim 1, wherein the operation instructions comprise:
an initialization file defining the operation settings;
a graph data structure comprising the trigger event and the tile output parameter associated with an edge of the graph data structure and the processing function as a node.

4. The method of claim 3, wherein operating a tile of the plurality further comprises:
at the control tile, calling a remote processing call for the tile based on the graph data structure, the remote processing call associated with the tile output; and
at the tile, executing a function associated with the remote processing call, wherein an output of the function comprises the tile output value.

5. The method of claim 4, wherein each remote processing call for each tile is associated with a predetermined output memory requirement, the method further comprising:
calculating a maximum output memory for the device based on the graph data structure and the predetermined output memory for each tile; and
in response to the maximum output memory exceeding the nonvolatile memory size, recommending a second control tile comprising more nonvolatile memory for the device to the user.

6. The method of claim 3, further comprising, at a graphical programming interface:
receiving a first node selection associated with a tile of the plurality;
receiving a second node selection associated with the processing function;
receiving a transition from the first node to the second node;
receiving a tile output parameter selection in association with the transition, the tile output parameter selection comprising a tile output type associated with the tile;
receiving a transition trigger event in association with the transition; and
automatically generating the operation instructions, comprising:
assigning the selected tile output parameter as the tile output parameter;
generating the graph data structure, wherein a parent node comprises the tile, a child node comprises a virtual process on the control tile configured to execute the processing function, and an edge connecting the parent node to the child node comprises the transition trigger event.

7. The method of claim 1, further comprising writing a processing function output, output by the processing function, to the common circular buffer.

8. A method comprising:
providing a device comprising a plurality of physical tiles electrically connected to a control tile, wherein each physical tile comprises a processing system and the control tile comprises a processing system and non-volatile memory partitioned into long-term and short-term storage, wherein each physical tile is associated with a predetermined set of configuration variables and remote processing calls;
storing an initialization file in the long-term storage, the initialization file comprising a value for each configuration variable of each tile;
in response to detection of an initialization event at the control tile, sending the values for each configuration value to the respective tile;
at the processor of each tile, initializing the respective tile based on the configuration value received from the control tile;
at each tile, sampling a measurement and sending data indicative of the measurement to the control tile;
storing the data in time order within a common circular buffer in the short-term storage;
monitoring the circular buffer for a trigger event at the control tile;
in response to occurrence of the trigger event:
identifying a measurement type associated with the trigger event; and
serially reading data associated with the measurement type off the circular buffer; and
processing the measurements associated with the read data according to a processing function associated with the trigger event.

9. The method of claim 8, wherein the processor of each tile prevents initialization of the respective tile until the respective operation settings are received.

10. The method of claim 8, wherein the control tile stores a graph data structure defining device operation, the graph data structure comprising the trigger event, the measurement type associated with the trigger event, and the processing function associated with the trigger event.

11. The method of claim 10, further comprising:
receiving a device operation change from a user account;
generating an updated graph data structure based on the device operation change; and
overwriting the graph data structure stored on the control tile with the updated graph data structure.

12. The method of claim 8, wherein each piece of data within the circular buffer has a fixed size.

13. The method of claim 12, wherein the data comprises a value for the measurement.

14. The method of claim 12, wherein the measurement size exceeds the fixed size, wherein the data indicative of the measurement comprises a tile identifier, a remote processing call identifier, and a measurement identifier, wherein the tile further comprises non-volatile tile memory storing the measurement, the method further comprising retrieving the measurement from the non-volatile tile memory based on the tile identifier, remote processing call identifier, and measurement identifier prior to processing.

15. A modular device comprising:
a control tile, comprising a control processor and non-volatile memory;
a plurality of tiles distinct from the control tile, each comprising a tile processor and associated with a set of configuration variables and a set of remote processing calls, each remote processing call generating a tile output;
a universal circular buffer stored by the nonvolatile memory that stores the values of the tile outputs from each of the plurality of tiles in order of arrival;
a graph data structure stored by the control tile, the graph data structure comprising a set of nodes connected by edges, wherein each tile of the plurality is represented as a tile node within the set of nodes, wherein each edge connected to a tile node is associated with a trigger event, a remote processing call associated with the tile represented by the tile node, and a reading module configured to read values of the tile output generated by the remote processing call; and an initialization file stored by the control tile, the initialization file comprising values for the configuration variables, wherein each of the plurality of tiles receive the respective values for the configuration variables from the initialization file prior to individual tile initialization.

16. The system of claim 15, wherein the nonvolatile memory is smaller than a collective memory footprint of the plurality of tiles.

17. The system of claim 15, wherein the control processor monitors the universal circular buffer for the trigger event, executes the reading module to read the values of the tile output associated with the edge with the reading module, and processes the values according to a processing function represented by a child node connected to the tile node.

18. The system of claim 17, wherein the control processor further writes an output of the processing function to the universal circular buffer.

19. The system of claim 15, wherein the values of all tile outputs have a fixed data size, wherein the plurality of tiles comprises an imaging tile, wherein the set of remote processing calls associated with the imaging tile comprises an image sampling call and an image return call, the imaging tile further comprising:

an imaging sensor that samples a measurement exceeding the fixed data size; and imaging memory that stores the measurement;

wherein the tile output generated by the image sampling call comprises a data packet comprising: an identifier for the imaging tile, an identifier for the image return call, and an identifier for the measurement within the imaging memory.

20. The system of claim 15, wherein each tile is associated with a set of required configuration variables, wherein the tile processor is configured to remain in a standby mode until values for all required configuration variables are received from the initialization file.

* * * * *